United States Patent [19]

Nishizawa et al.

[11] 4,297,718

[45] Oct. 27, 1981

[54] VERTICAL TYPE FIELD EFFECT TRANSISTOR

[75] Inventors: Jun-Ichi Nishizawa, Sendai; Takashi Kitsuregawa, Itami, both of Japan

[73] Assignee: Semiconductor Research Foundation Mitsubishi Denki K.K., Japan

[21] Appl. No.: 693,894

[22] Filed: Jun. 8, 1976

Related U.S. Application Data

[63] Continuation-in-part of Ser. No. 469,017, May 10, 1974, abandoned.

[30] Foreign Application Priority Data

May 22, 1973 [JP] Japan .................................. 48-58054

[51] Int. Cl.³ .................................................. H01L 29/80
[52] U.S. Cl. .......................................... 357/22; 357/20; 357/36; 357/51
[58] Field of Search ........................ 357/14, 22, 23, 51, 357/20

[56] References Cited

U.S. PATENT DOCUMENTS

| | | | |
|---|---|---|---|
| 3,011,104 | 11/1961 | Watanabe et al. | 357/14 |
| 3,436,689 | 4/1969 | Fluhr | 357/22 |
| 3,564,442 | 2/1971 | Germann | 357/23 |
| 3,663,873 | 5/1972 | Yagi | 357/22 |
| 3,814,995 | 6/1974 | Teszner | 357/22 |
| 3,905,036 | 9/1975 | Goronkin | 357/22 |

*Primary Examiner*—William D. Larkins
*Attorney, Agent, or Firm*—Robert E. Burns; Emmanuel J. Lobato; Bruce L. Adams

[57] ABSTRACT

Vertical type field effect transistors are disclosed including one of the highly doped source, gate and drain regions disposed on one of the main opposite faces of one of the semiconductor substrate and the remaining region or regions disposed on the other mainface of the substrate. At least one of the regions is divided into a plurality of elongated slender portions and metallic electrodes are disposed in ohmic contact with the respective regions so as to be identical in configuration to the latter. The highly doped regions themselves may form electrodes.

3 Claims, 26 Drawing Figures

FIG. 1
FIG. 2
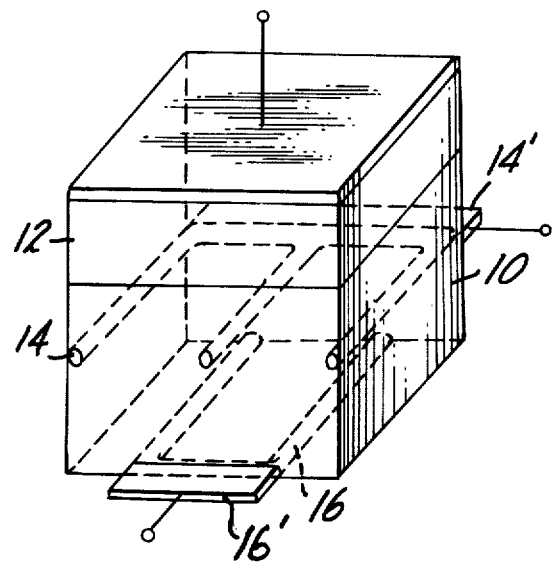
FIG. 3b
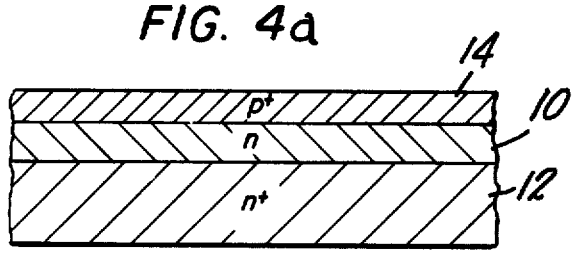
FIG. 4a
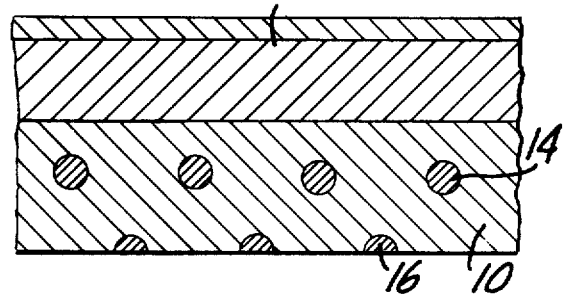
FIG. 3a
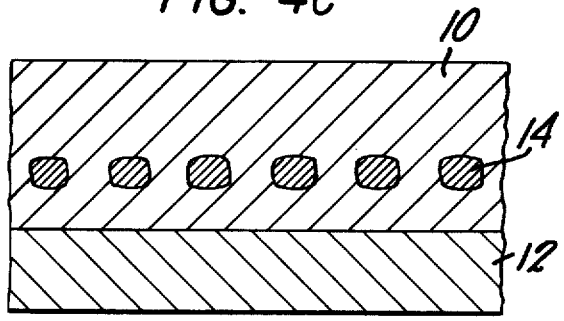
FIG. 4c
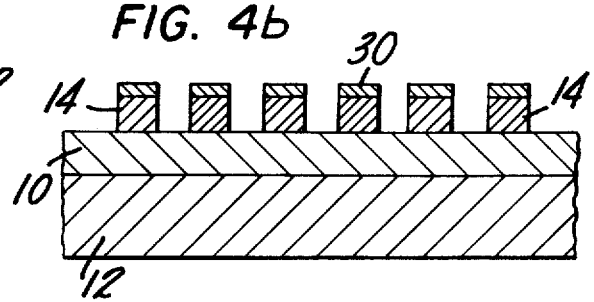
FIG. 4b
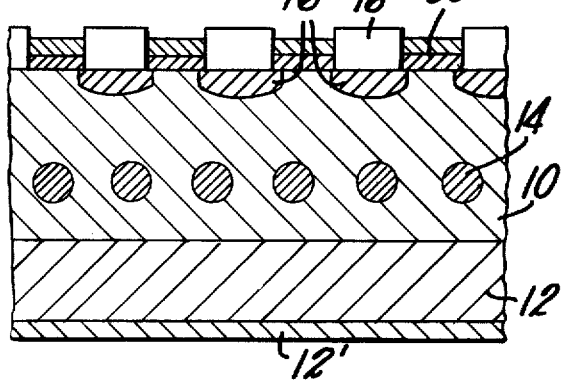
FIG. 4e
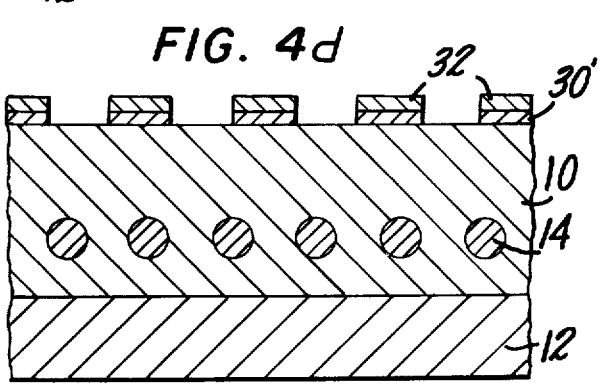
FIG. 4d

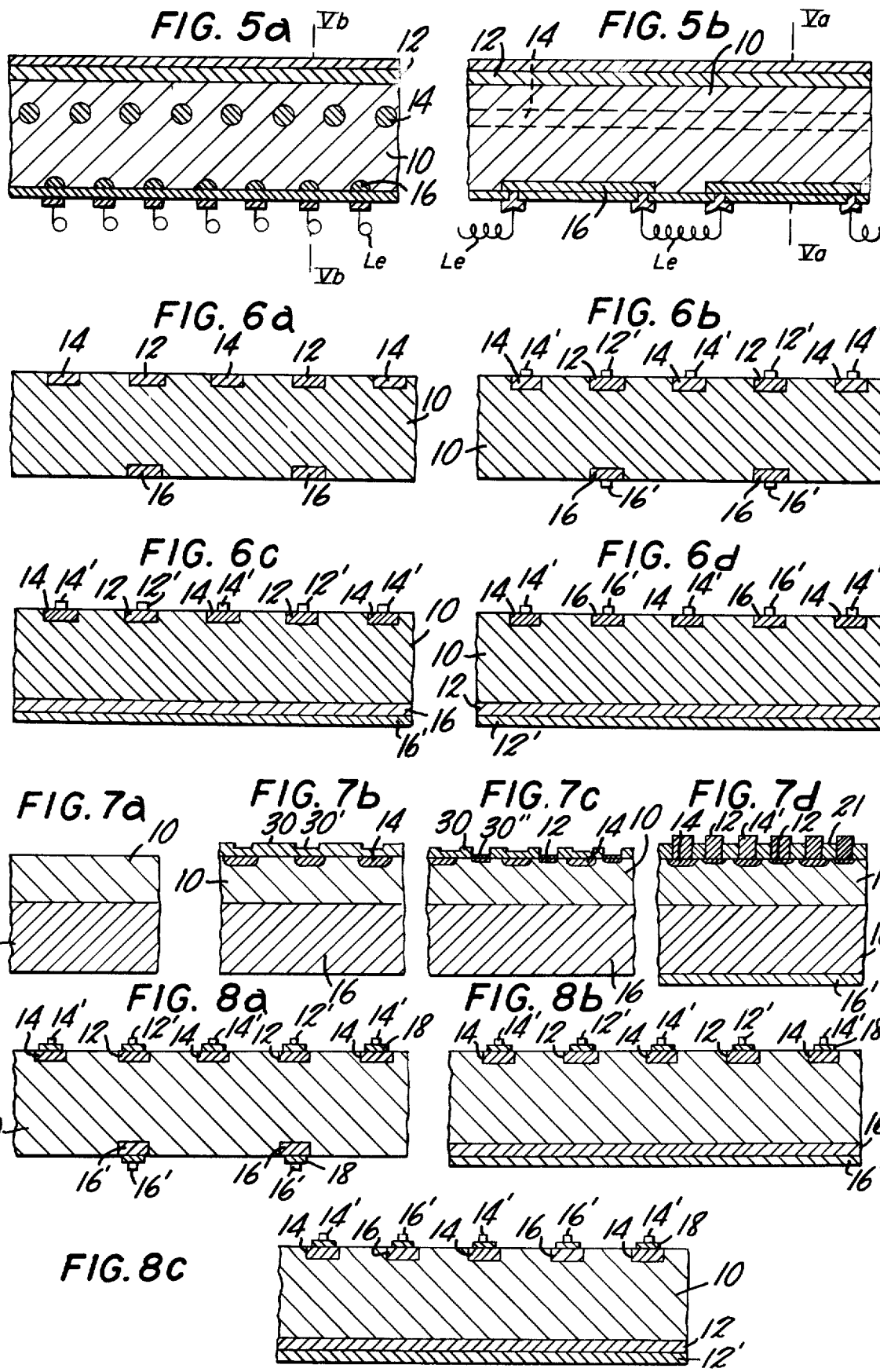

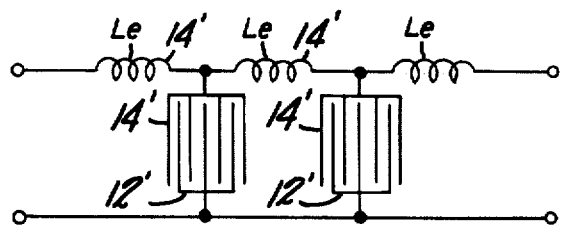
FIG. 9a
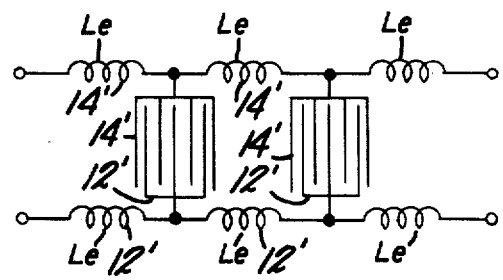
FIG. 9b
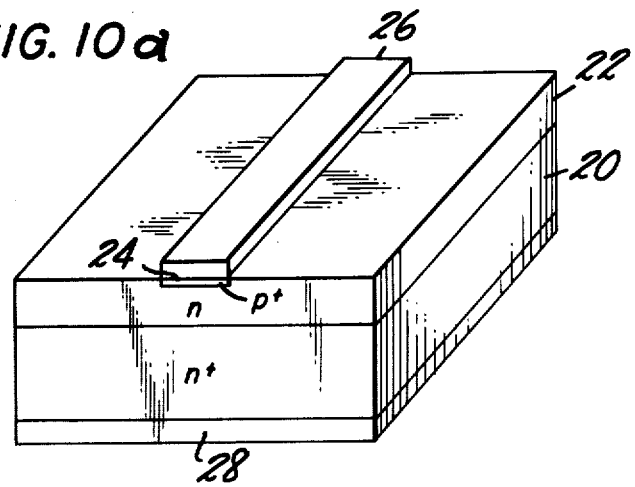
FIG. 10a
FIG. 10b
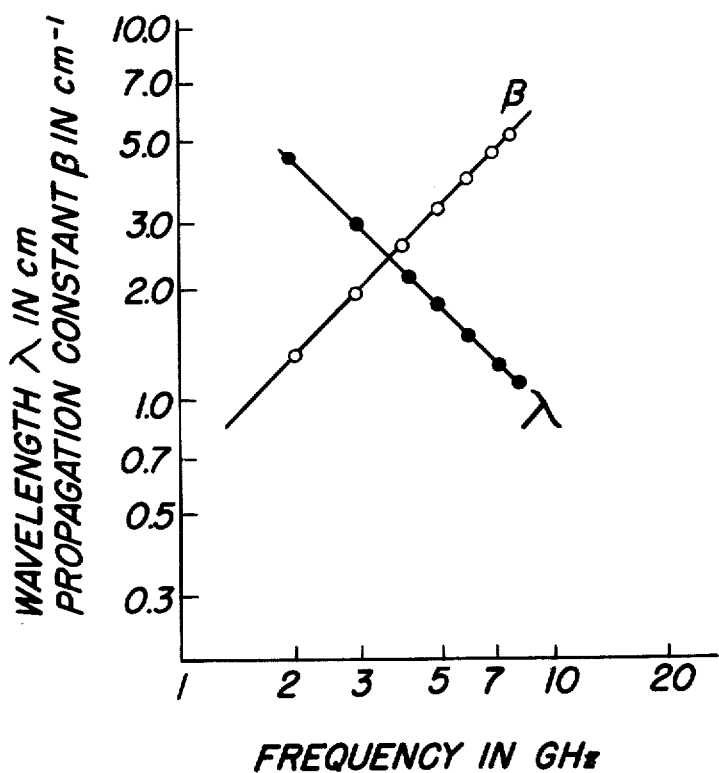

VERTICAL TYPE FIELD EFFECT TRANSISTOR

This is a continuation-in-part of U.S. Pat. application Ser. No. 469,017 filed on May 10, 1974 and now abandoned.

BACKGROUND OF THE INVENTION

This invention relates to improvements in vertical type field effect transistors.

Field effect transistors are preferably small in size and light in weight as far as practicable while having the accuracy as high as possible. Conventional field effect transistors to which the present invention is concerned have included electrodes disposed only on the surface thereof. This has limited the number of electrodes that can be disposed on a field effect transistor. Particularly in integrated circuits, conventional field effect transistors have been scarcely used at high frequencies because interelectrode capacitances increase as distances between electrodes involved become small.

To eliminate these objections, it has been already proposed to embed a semiconductor region with a high impurity concentration in the substrate for field effect transistors thereby to dispose electrodes not only on the surface of the substrate but also in the interior thereof. Conventional field effect transistors having semiconductor regions with high impurity concentration embedded in the substrate therefor have been disadvantageous in that the presence of the capacitance renders the input impedance very low at high frequencies which is attended with a decrease in cut-off frequency. This decrease in input impedance and therefore in cut-off frequency is particularly marked in integrated circuits. Accordingly conventional field effect transistors with embedded semi-conductor regions of high impurity concentration have been scarcely used at high frequencies.

SUMMARY OF THE INVENTION

Accordingly it is an object of the present invention to provide a new field effect transistor having a transmission line structure operative at high frequencies.

The present invention provides a vertical type field effect transistor comprising a substrate of semiconductive material having a pair of main opposite faces, and one of a source, gate and drain electrodes disposed on one of the main faces of the substrate and the remaining electrode or electrodes disposed on the other main face of the substrate. The electrodes are formed of highly doped semiconductor regions embedded in the substrate and at least one of the electrodes is elongated and slender and has a dimension and an impurity concentration giving low resistance in a direction of travel of an electromagnetic wave therethrough to provide a transmission line structure operative in the traveling wave mode.

The electrodes may comprise metallic electrodes disposed in ohmic contact with the highly doped semiconductor regions so as to be identical in configuration to the latter.

BRIEF DESCRIPTION OF THE DRAWINGS

The present invention will become more readily apparent from the following detailed description taken in conjunction with the accompanying drawings in which:

FIG. 1 is a schematic circuit diagram illustrating a four terminal network equivalent to a conventional semiconductor device;

FIG. 2 is a circuit diagram similar to FIG. 1 but illustrating a transmission line useful in explaining the principles of the present invention;

FIG. 3a is a fragmental schematic sectional view of a vertical type field effect transistor constructed in accordance with the principles of the present invention;

FIG. 3b is a perspective view of the arrangement shown in FIG. 3a;

FIGS. 4a through 4e are fragmental schematic sectional views illustrating the steps of manufacturing a vertical type field effect transistor such as shown in FIGS. 3a and 3b;

FIG. 5a is a fragmental schematic sectional view of a modification of the present invention taken along the line Va—Va of FIG. 5b;

FIG. 5b is a view similar to FIG. 5a but illustrating a section taken along with the line Vb—Vb of FIG. 5a;

FIG. 6a is a fragmental schematic sectional view of another field effect transistor constructed in accordance with the principles of the present invention;

FIG. 6b is a view similar to FIG. 6a but illustrating electrodes disposed on the arrangement shown in FIG. 6a;

FIGS. 6c and 6d are fragmental schematic sectional views of different modifications of the present invention;

FIGS. 7a through 7d are fragmental schematic sectional views illustrating the steps of manufacturing the arrangement shown in FIG. 6c;

FIGS. 8a, 8b and 8c are fragmental schematic sectional views of different modifications of the present invention;

FIGS. 9a and 9b are diagrams illustrating separate modifications of the present invention formed in an integrated circuit;

FIG. 10a is a perspective view illustrating a transmission line structure included in a vertical type field effect transistor constructed in accordance with the principles of the present invention; and FIG. 10b is a graph illustrating the transmission characteristics of the arrangement shown in FIG. 10a.

DESCRIPTION OF THE PREFERRED EMBODIMENTS

Referring now to FIG. 1 of the drawings, there is illustrated, a four terminal network representative of a conventional semiconductor device operated at high frequencies. As shown in FIG. 1, the four terminal network illustrated has only parallel capacitances uniformly distributed therealong with each unit length having a capacitance C, but the line has no series inductance. Therefore the network has an impedance per unit length expressed by $1/j\omega C$ where $j$ designates the unit for imaginary numbers and $\omega$ designates an angular frequency of an alternating current or voltage for the line. The impedance of $1/j\omega C$ directly depends upon the frequency and decreases are the frequency increases. Therefore field effect transistors such as represented by the four terminal network as shown in FIG. 1 have the cut-off frequency lowered as the particular frequency becomes high.

The present invention contemplates to eliminate the disadvantages of the prior art practice as above described and provides a vertical type field effect transistor having semiconductor regions with high impurity concentrations embedded in a substrate involved and electrode structures for the semiconductor regions, at least one of the embedded semiconductor regions and the associated electrode structure being given an inductance per unit length sufficient to improve the input impedance, thereby to decrease in frequency dependency for the purpose of using the transistor even at high frequencies.

If a field effect transistor operated in a high frequency band includes a transmission portion greater than $\lambda/4$ in length where $\lambda$ designates a wavelength involved, then the associated phase is rotated until a reverse phase-sequence component is developed in a current flowing through the transmission portion. The reverse phase-sequence component tends to perform the current off-setting operation. Therefore the transmission portion has preferably its length smaller than $\lambda/4$. In other words, a distance of propagation of a wave for a time interval of $1/f$ is of one wavelength thereof or $\lambda = 1/(f\sqrt{LC})$ for a propagation velocity of $1/\sqrt{LC}$ where f is the corresponding frequency and L and C are in inductance and a capacitance for unit length of the transmission portion respectively. This means that the transmission portion has preferably a length of at most $\frac{1}{4}f\sqrt{LC}$.

According to the principles of the present invention, however, the length of the transmission portion may be greater than one quarter wavelength $\lambda/4$ involved. This is one of the characteristic features of the present invention. To this end, for example, the drain region of field effect transistors may be elongated and slender, or divided into a plurality of portions. Alternatively, the divided portions of the drain region may be connected to one another through the external inductive elements or coupled to a strip line. These structures are effective for imparting a phase shift to the drain circuit to compensate for the overall phase shift.

FIG. 2 shows a transmission line theoretically representative of a field effect transistor constructed in accordance with the principles of the present invention and operated at high frequencies. By comparing FIG. 2 with FIG. 1, it is apparent that the transmission line of FIG. 2 is different from that shown in FIG. 1 only in that in FIG. 2 a series inductance L is connected between each pair of parallel capacitances C to form an L-C ladder circuit configuration. Assuming that the transmission line has a length of l, and an inductance L and a capacitance C per unit length, the characteristic impedance Zo is expressed by $\sqrt{L/C}$ which is not dependent upon a line frequency involved. If the line angular frequency $\omega$ fulfills the relationship $\omega > 1/l\sqrt{LC}$, then the addition of the inductances L to the line permits the impedance thereof to be increased because the relationship $\sqrt{L/C} > 1/\omega \cdot l \cdot C$ is held.

Assuming that an electric conductor has a length of l and a diameter of d, the conductor has an inductance L in a high frequency band expressed by $$L = 2l\left(l_n \frac{4l}{d} - l\right) \text{ (nanohenries)}.$$

Where l and d are expressed in centimeters.

From the above equation it will be appreciated that, in order to add the inductance to a semiconductor region with a high impurity concentration embedded in a substrate of semiconductive material a conductive element or region which is large in the line length l and small in the conductor's diameter d, that is to say, is slender and elongated is required to be disposed on the surface of the substrate or in the interior thereof.

When the transmission line structure as above described is applied to transistors, traveling wave transistors are produced whose concept is already evident as described, for example, in G. W. McIver article entitled "Traveling Wave Transistor", Proc. IEEE Vol. 53, (November, 1965), pages 1747 and 1748. The present invention applied the concept of traveling wave transistors to vertical type field effect transistors newly developed and provides concrete structures thereof. Transistors formed into the transmission line structure have inter-electrode capacitances incorporated, as structural elements, into the transmission line so that, if they have the dimension increased in a direction of transmission of an electromagnetic wave involved does not lead to the deterioration of the frequency characteristics due to the inter-electrode capacitances. Particularly, where a pair of electrodes forming a transmission line have one end terminated with the characteristic impedance of the line, it is possible to perform ideally the operation having scarcely the frequency characteristics. For example, the frequency characteristics begin to be changed at an operating frequency approaching a frequency determined by the reciprocal of a time interval required for carriers to be transisted from the source to the drain of field effect transistors.

The description will now be made in conjunction with a process of producing a semiconductor device having added thereto an inductance. Pure hydrogen with a predetermined flow rate, as a carrier gas, flows through a container including therein silicon tetrachloride ($SiCl_4$) mixed with about 3% by volume of boron tribromide ($BBr_3$) while pure hydrogen with a predetermined flow rate, as a carrier gas, flows through another container including therein silicon tetrachloride ($SiCl_4$) mixed with about 40% by volume of germanium tetrachloride ($GeCl_4$). Simultaneously pure hydrogen with a predetermined flow rate, as a carrier gas, flows through a separate container including therein silicon tetrachloride ($SiCl_4$).

Then volumes of pure hydrogen including the ingredients as above described from the three containers are delivered to a furnace having disposed therein a silicon substrate heated to 1200° C. In the furnace, the ingredients are subject to a reduction reaction to grow a silicon layer highly doped with germanium and boron upon the silicon substrate.

The grown layer is compensated for stress occurring therein so as to be low in strain as a whole. This is because the grown layer includes germanium having a tetrahedral covalent radius of 1.22 Å greater than that of silicon having a value of 1.17 Å and boron having a tetrahedral covalent radius of 0.88 Å smaller than that of silicon. The grown layer has had a high impurity concentration of about $2 \times 10^{20}$ boron atoms per cubic centimeter.

The silicon substrate having the grown layer disposed thereon can be subject to selective growth, selective diffusion, selective etching etc. well known in the art to form a field effect transistor including elongated slender semiconductor regions with high impurity concentrations as desired.

As an example, a semiconductor region with a high impurity concentration such as above described was formed into a circular rod having a radius of 5 microns and a length of 1 centimeter in a silicon substrate having an impurity concentration of $8 \times 10^{12}$ atoms per cubic centimeter. The rod had an inductance of 14.56 nanohenries and a capacitance of 6 picofarads, resulting in the characteristic impedance of about 49 ohms, in the ultra-high frequency band. On the other hand, a conventional field effect transistor without an added inductance can have the characteristic impedance of $2.65 \times 10^{-1}$ ohm at 100 gigahertzs due to the presence of inter-electrode capacitances. Thus the present invention can increase the characteristic impedance by a factor of about two hundreds (200).

While the present invention has been described in conjunction with a combination of the elements, silicon germanium and boron it is to be understood that the same is not restricted to the process and starting elements as above described and that it is equally applicable to a variety of processes of producing semiconductor regions high in impurity concentration and to a variety of combinations of semiconductive, doping and compensating elements, for example, silicon (Si) antimony (Sb) and phosphorous (P), silicon (Si), germanium (Ge) and phosphorous (P), gallium (Ga) arsenic (As), tin (Sn) and silicon (Si), gallium (Ga), phosphorous (P) and tin (Sn), indium (In), gallium (Ga), phosphorous (P) and tin (Sn) etc. It is essential that a semiconductor region with a high impurity concentration, compensated for stresses to be low in strain as a whole should be formed by using elements larger and smaller in covalent radius than the particular semiconductive element. Instead of silicon n-type gallium arsenide (GaAs) may be preferably used with a high resistance layer in view of the standpoint of the frequency characteristic.

FIGS. 3a and 3b show a vertical type field effect transistor constructed in accordance with the principles of the present invention. The arrangement illustrated comprises a substrate 10 of semiconductive material forming a channel, a source region 12 disposed on one of the main faces, in this case, on the upper main face as viewed in FIG. 3b of the substrate over the entire area, a gate region 14 embedded in the substrate 10 on the intermediate portion, and a drain region 16 embedded in the substrate 10 adjacent to the lower or other main face.

The source region 12 is also adapted to be connected to ground. The gate and drain regions 14 and 16 respectively are high in impurity concentration and divided, for example, into three and two of elongated, slender fingers for the purpose of adding to each of the regions 14 and 16 an inductance such as above described. Both regions 14 and 16 are partly exposed to the adjacent faces of the substrate 10 and the exposed portions thereof are provided with respective electrodes designated electrode 14' for the gate region 14 and electrode 16' for the drain region 16 as shown in FIGS. 3a and 3b.

In the arrangement shown in FIGS. 3a and 3b the substrate channel 10 is of an N type having an impurity concentration of from about $1 \times 10^{13}$ to $5 \times 10^{15}$ atoms per cubic centimeter. The source region 12 is of an N+ type having a resistivity of from 0.1 to 0.005 ohm-centimeter and has a thickness of from about 30 to 100 μm. The gate region 14 is of a P+ type having an impurity concentration of $1 \times 20^{20}$ atoms per cubic centimeter or more and includes the divided fingers having a diameter of from 2 to 10 μm and disposed at intervals from about 2 to 15 μm. It is noted that spacings between the gate fingers can be decreased as the channel 10 increases in impurity concentration. In other words, the impurity concentrations of the channel 10 and the spacings between the gate fingers should be selected so that the channel is pinched off with an applied gate voltage alone. The drain region 16 is of an N+ type having an impurity concentration on the order of $1 \times 20^{20}$ atoms per cubic centimeter. When a metallic electrode is disposed in ohmic contact with the drain region 16, the impurity concentration thereof may decrease to about $1 \times 10^{18}$ atoms per cubic centimeter. The drain region is not necessarily required to be divided into a plurality of elongated slender fingers as shown in FIG. 3 and may be formed of an N+ type region disposed on the lower main face of the substrate throughout the entire area as does the source region 12. In this case the N+ type region may also serve as a drain electrode with a metallic electrode for the drain region omitted. The source region 12 is spaced away from the gate and drain regions 14 and 16 by distances of from about 1 to 16 μm and from about 4 to 30 μm respectively.

With the arrangement of FIGS. 3a and 3b put in the common source configuration by having the source connected to ground, an input line formed of the source and gate regions is required to be equal in velocity of propagation of an electromagnetic wave or in propagation constant to an output line formed of the source and drain regions.

As best shown in FIG. 3a the gate and drain regions formed into elongated, slender electrodes respectively resulting in a transmission line structure including an elongated line disposed in opposite relationship above a planar source electrode. If an N+ type region is disposed on the lower main face of the substrate throughout the entire area to form a drain electrode as above described, the source-to-gate line can be equal in propagation constant to the source-to-drain line. In this case a parallel plane transmission line is formed of the source and drain regions or electrodes. It has been found that in this case, the characteristic features of traveling wave transistors are still retained although the parallel plane transmission line becomes low in impedance.

Vertical type field effect transistors such as shown in FIG. 3 exhibit the current-to-voltage characteristic resembling that of triodes. That is, such transistors have the current therethrough gradually increased with an increase in voltage applied thereacross. This is because the injection of carriers from the source region is controlled with a potential barrier formed in the front of the source region. On the contrary, conventional field effect transistors have the current therethrough saturated with an increase in voltage applied thereacross and therefore resemble in current-to-voltage characteristic of pentodes.

In order to operate a highly doped semiconductor region of elongated slender shape embedded in a semiconductor substrate as a transmission line, the relationship $\omega L \geq R$ must be held between an inductance L and a resistance R exhibited by a unit length of the region operated at an angular frequency $\omega$. For example, assuming that a highly doped semiconductor region in the form of a cylinder having a diameter of 25 microns to have an inductance of 11 nanoheries per centimeter is operated at a frequency of 5 gigahertzs. The region is required to have a resistivity not higher than $1 \times 10^{-3}$ ohm-centimeter or an impurity concentration of at least $1 \times 10^{20}$ atoms per cubic centimeter in order to hold the relationship $\omega L \geq R$. Only when a highly doped semiconductor region just described has been formed the resulting structure is effectively operated as a transmission line. If the highly doped semiconductor region is located on a surface of the substrate as a drain region and has a metallic electrode disposed thereon then the impurity concentration thereof may not be so high.

While the source, gate and drain electrodes can be formed of respective semiconductor regions with high impurity concentration alone, a metallic electrode is in many cases disposed in ohmic contact with each of the semiconductor regions. In the latter case the semiconductor region may have an impurity concentration of from $10^{17}$ to $10^{21}$ atoms per cubic centimeter.

As an example, the arrangement shown in FIG. 10a was produced by growing on an N+ type silicon substrate 20 an N type semiconductor layer 22 having an impurity concentration of from about $1 \times 10^{13}$ to $1 \times 10^{14}$ atoms per cubic centimeter and a thickness of from 10 to 15 μm and forming a P+ type diffusion layer 24 having an impurity concentration of from about $5 \times 10^{18}$ to $1 \times 10^{19}$ atoms per cubic centimeter to be 0.5 μm deep and 8 μm wide in the N type layer. Then an aluminum electrode 26 was disposed in ohmic contact with the P+ type diffusion layer 24 to be coextent with the latter while another aluminum electrode 28 was similarly disposed on the exposed surface of the substrate throughout the entire area. Then the arrangement thus produced was biased so as to reversely bias P+NN+ junctions and its propagation constant $\beta$ was measured at various frequencies with an electromagnetic wave traveling along the arrangement through the electrodes 26 and 28. The results of the measurements are indicated by circles in FIG. 10b wherein the axis of ordinates represents a propagation constant $\beta$ and the axis of abscissas represent a frequency in gigahertzs of a traveling wave. Also FIG. 10b shows a wavelength $\lambda$ defined by $2\pi/\beta$ of the wave traveling along the arrangement at dots.

The arrangement of FIG. 10a has a capacitance C between the P+ and N+ layers or both electrodes and an inductance L approximately expressed respectively by $$C = \frac{\epsilon_r}{C_o \eta} \cdot \frac{W}{h} \left[ 1 + \frac{h}{W} \left( 0.8 + \frac{1}{\epsilon_r} \frac{2}{\pi} l_n \left( \frac{2W}{\pi h} + 2 \right) \right) \right] / \text{ and}$$

$$L = \frac{\mu_o \frac{h}{W}}{1 + \frac{h}{W} \left( 0.8 + \frac{2}{\pi} l_n \left( \frac{2W}{\pi h} + 2 \right) \right)^1}$$

where $\epsilon_r$ = relative dielectric constant of silicon
$C_o$ = light velocity in vacuum
$\eta$ = free space impedance
$\mu_o$ = permeability of silicon
h = spacing between P+ and N+ type regions
W = width of P+ type region
l = length of transmission line measured along direction of propagation of wave.

Since the propagation constant $\beta$ is expressed by $\beta = \omega \sqrt{LC}/l$ a theoretical value thereof can be designated by solid line labelled $\beta$ in FIG. 10b by putting l=1 cm, W=8 μm, h=10 μm, $\epsilon_r$=11.9, $\mu_o$=1.257×$10^{-8}$ henry per centimeter Co=3×$10^{10}$ centimeter per second and $\eta$=376 ohms in the above two equations. In FIG. 10b it is seen that the measured values of the propagation constant $\beta$ substantially lie in the solid line labelled $\beta$ and the logarithmic value thereof is proportional to that of the frequency. This means that the above equation for the "L" is well held with the actual structure of semiconductor devices. For example, the arrangement of FIG. 10a has an inductance L calculated at 6.8 nanoheries with W=5 μm, h=10 μm, l=1 cm and $\epsilon_r$=11.9.

While the measurements as above described was conducted with a pair of metallic electrodes 26 and 28 disposed in ohmic contact with the N+ and P+ layers 20 and 24, it will readily be understood that with the highly doped layers 20 and 24 used as respective electrodes by omitting the metallic electrodes 26 and 28, the resulting propagation constant $\beta$ will be greater than the measured constant as above described because of an increase in resistance appearing in the direction of travel of the wave.

Therefore the field effect transistor as shown in FIGS. 3a and 3b will form a distributed constant network including a multiplicity of parallel L-C ladder units. The drain region 16 is preferably divided into fingers as many as possible while the divided fingers are elongated and slender as far as practicable.

A vertical type field effect transistor such as shown in FIGS. 3a and 3b can be produced according to the manufacturing steps shown in FIGS. 4a through 4e. First a gaseous mixture of hydrogen (H₂), silicon tetrachloride (SiCl₄) and phosphorous trichloride (PCl₃) is passed over one of opposite main faces of an N type silicon substrate heated at 1200° C. to grow thereon an N type layer having an impurity concentration of from $3 \times 10^{13}$ to $3 \times 10^{15}$ atoms per cubic centimeter and a thickness of from 2 to 6 μm and then another gaseous mixture of hydrogen (H₂), silicon tetrachloride (SiCl₄), boron tribronide (BBr₃) and tin tetrachloride (SnCl₄) is passed over the other main face of the heated substrate to form a P type grown layer thereon. The silicon tetrachloride, boron tribromide and tin tetrachloride have molar ratios of 100:1:0.8 and the P type grown layer has an impurity concentration on the order of $4 \times 10^{20}$ atoms per cubic centimeter and a lattice constant equal to that of the intrinsic semiconductor. If silicon is doped with boron smaller in atomic radius than the same then the doped silicon decreases in lattice constant resulting in the occurrence of strains and therefore dislocations. In order to reduce those strains, tin (Sn) or germanium (Ge) greater in atomic radius than silicon is added to the silicon simultaneously with boron as a dopant.

The resulting structure is shown in FIG. 4a wherein the silicon substrate 10 is shown as being sandwiched between the N+ type layer 12 and the P+ type grown layer 14.

Following this an oxide film 30 is applied to the P+ type grown layer 14 according to an oxidation process well known in the art and selectively etched away according to photolithographic technique. Then the P+ type grown layer 14 is selectively etched away with a mixture of hydrofluoric acid (HF) and nitric acid (HNO₃) with the not-etched portion of the oxide film 21 utilized as a mask to be formed into a plurality of elongated slender fingers of square cross section. This results in a structure shown in FIG. 4b.

After the oxide film 30 has been removed with hydrofluoric acid (HF), an N type epitaxial layer is grown on the exposed surface of the substrate 10 and around the fingers 14 through the thermal decomposition of a gaseous mixture of hydrogen (H₂) and silicon tetrachloride (SiCl$_4$) including arsenic trichloride (AsCl$_2$) in a proportion of $10^{-8}$ relative to silicon tetrachloride. The now grown layer is also designated by the reference numeral 10. The resulting structure is shown in FIG. 4c and includes a substrate formed of the layer and silicon substrate 10.

On the exposed surface of the N type epitaxial layer 10. An oxide film 30' is disposed to a thickness of about 500 A and then is overlaid by a nitride film 32 formed through the thermal decomposition of hydrogen (H$_2$) silane (SiH$_4$) and ammonia (NH$_3$) at about 700° C., the film 32 being about 1000 A thick. Then photolithographic technique is utilized to selectively etch the oxide and nitride films 30' and 32 respectively one after the other. The oxide film 30' is selectively etched away with phosphoric acid (H$_3$PO$_4$) while the nitride film 32 is similarly etched away with hydrofluoric acid (HF). This results in a structure shown in FIG. 4d.

Subsequently tin (Sn) is first selectively difused into the N type layer 10 and then phosphorous (P) is similarly diffused into the same layer to form an N+ type region 16 divided into a plurality of elongated, slender fingers 3 microns deep. Every portion of the N+ type diffusion region 16 includes phosphorous (P) and tin (Sn) so that the phosphorous has a concentration of $2 \times 10^{20}$ atoms per cubic centimeter and the tin has a surface concentration of $6 \times 10^{19}$ atoms per cubic centimeter. The tin serves to reduce strains of the lattice constant due to the addition of the phosphorous.

During the diffusion operation, an oxide film 30" is formed on the surface of the N+ type layer 10. Thus oxide film can be removed with hydrofluoric acid (HF). In that event it is to be noted that the selective etching is only effected on that portion of the oxide film 30" required for an electrode to be disposed in ohmic contact with the diffusion region 16 while an oxide film (not shown) on the exposed surface of the N+ type grown layer 12 is entirely removed. After the removal of the oxide films, aluminum (Al) is selectively evaporated on the exposed surface of the N+ type diffusion region 16 to form an electrode 16' therefor while at the same time aluminum is evaporated on the entire surface of the grown layer 12 to form an electrode 12' therefor.

After the completion of the manufacturing steps as above described, a structure shown in FIG. 4e results and includes the P+ type layer 14 including a plurality of substantially circular fingers having a diameter of from about 3 to 5 microns. This is because the square fingers 14 shown in FIG. 4b effect the re-diffusion in the processes as described in conjunction with FIGS. 4c, 4d and 4e form circular fingers. A metallic electrode 14 may be provided on a desired portion thereof exposed to one of the lateral surface of the structure in usual manner after the mesaetching has been effected on the corresponding portion of the one lateral surface of the structure.

In FIGS. 5a and 5b wherein like reference numerals designate the components identical or similar to those shown in FIGS. 3a and 3b, there is illustrated a modification of the arrangement shown in FIGS. 3a and 3b. The arrangement illustrated is different from that shown in FIGS. 3a and 3b only in that each of the divided fingers of the drain region 16 disposed on the other main face of the substrate is divided into a plurality of discrete portions in a direction of travel of a wave and externally interconnected through respective inductive elements L$_e$. Thus the arrangement is of the divided drain type and operative to compensate a phase shift occurring in an input transmission line formed of the source and gate regions by that occurring in an output transmission line formed of the source and drain regions. In other words, the inductive elements L$_e$ serve to equal a phase velocity of a wave traveling along the inout transmission line to that of a corresponding wave traveling along the output transmission line while at the same time adding further inductances to the drain region, resulting in high frequency compensation. Further some of an output power from the arrangement shown in FIGS. 5a and 5b can radiate to a utilization device through the inductive elements L$_e$. Thus the arrangement can be used as a high power oscillator for electronic cooking ovens.

In FIG. 6a, a source region 12 divided, for example, into two elongated slender fingers and a gate region 14 divided into three elongated, slender finger are embedded in a semiconductor substrate 10 on one of main opposite faces. A drain region 16 is also divided into two elongated, slender fingers and embedded in the substrate 10 on the other main face.

In the arrangement of FIG. 6a, the substrate 10 forming a channel is of an N type having an impurity concentration of from about $3 \times 10^{13}$ to $3 \times 10^{15}$ atoms per cubic centimeter. The source and drain regions 12 and 16 respectively are of an N+ type and the gate region 14 is of a P+ type. All the regions have impurity concentrations of $1 \times 10^{20}$ atoms per cubic centimeter or more. The channel 10 has a thickness ranging from about 4 to 30 μm, and the source region 12 has a depth of 1 μm and a width of from about 1 to 5 μm. The gate region 14 has a depth of from 1 to 3 μm and a width of from about 4 to 10 μm, while the drain region 16 has a depth on the order of 1 μm and a width of from about 5 to 50 μm.

FIG. 6b shows an arrangement substantially identical to that illustrated in FIG. 6a excepting that fine strips 12', 14' and 16' made of a metal low in resistivity are disposed in ohmic contact with the source, gate and drain regions 12, 14 and 16 respectively to be coextensive with the latter respectively. The metallic strips form electrodes and serve to decrease the line loss.

The arrangement shown in FIG. 6c is different from that illustrated in FIG. 6b in that in FIG. 6c the drain region 16 and therefore the drain electrode 16' is not divided. In the arrangement of FIG. 6c, both of the source and gate electrode 12' and 14' respectively may have added thereto an inductance or inductances, if desired. The arrangement forms a traveling wave circuit through the utilization of the impedance improved in the ultra-high frequency band. Because of the use of metal wiring, the associated resistance becomes low. Thus it is to be understood that the cut-off frequency is relatively high.

The arrangement shown in FIG. 6d is different from that illustrated in FIG. 6c in that in FIG. 6d the drain region 16 and its electrode 16' are exchanged for the source region 12 and its electrode 12'.

In FIG. 6a it is noted that the source, gate and drain regions 12, 14, 16 respectively serve also as individual electrodes with metallic electrodes omitted. On the other hand, in FIGS. 6b, 6c and 6d the metallic electrodes are provided on the source, gate and drain regions which permits impurity concentrations of the respective regions to decrease to about $1 \times 10^{18}$ atoms per cubic centimeter.

The arrangement of FIG. 6c can be produced following the manufacturing steps shown in FIGS. 7a through 7d. In FIG. 7a, an N type semiconductor region 10 high in resistivity is disposed on a semiconductor substrate of N type silicon having a resistivity as low as on the order to from 0.1 to 0.005 ohm-centimeter through the reduction of silicon tetrachloride ($SiCl_4$) and phosphorous trichloride ($PCl_3$) with hydrogen at 1200° C.

As shown in FIG. 7b an oxide film 30 is disposed on the exposed surface of the N type layer 10 in conventional manner and then selectively etched away according to photolithographic technique. This results in the formation of a plurality of parallel strip-shaped windows. The arrangement thus processed is heated at 1000° C. in an atmosphere consisting of nitrogen ($N_2$), oxygen ($O_2$) and boron trichloride ($BBr_3$) whereupon boron (B) is selectively diffused into the N type layer 10 through the windows to form a P type diffusion region 14 in the form of divided fingers and also an oxide film 30' is formed upon the diffusion region 14.

Then photolithographic technique is again utilized to form a plurality of parallel strip-shaped windows on the oxide film 30 between the P type diffusion fingers 14. Phosphorous is selectively diffused into the substrate 10 through the now formed windows to form an N type diffusion region 12 in the form of divided fingers with another oxide film 30'' formed on the N type diffusion region 12. The resulting structure is shown in FIG. 7c.

Following this, each of both oxide films 30' and 30'' is provided with a plurality of parallel strip-shaped windows positioned on the fingers of the regions 14 and 12. Then aluminum is selectively evaporated within the windows upon the exposed surface portions of the N type region 10 to form electrodes for the regions 12 and 14. Simultaneously an electrode 16' for the substrate 16 may be formed on the entire exposed surface thereof after an oxide film has been removed from that surface. The resulting structure shown in FIG. 7d.

FIG. 8a shows still another modification of the arrangement of FIG. 6b. In the arrangement illustrated, a strip 18 of magnetic material of high permeability is disposed in ohmic contact with each of the fingers of the source, gate and drain regions 12, 14 and 16 respectively to be coextensive with each finger. The metallic electrodes in the form of slender strips 12', 14' and 16' overlie the respective magnetic strip 18. The magnetic strip is effective for increasing the inductance added to the associated fingers of the source, gate and drain regions.

If the magnetic material of the strip 18 is low in resistivity then the metallic electrodes may be omitted and instead, the strips may be used as the electrodes.

FIGS. 8b and 8c are substantially similar to those illustrated in FIGS. 6c and 6d respectively except that in FIGS. 8b and 8c the electrodes 12', 14' and 16' overlie divided electrodes are underlaid by the magnetic strips 18.

FIG. 9a is a view of an integrated circuit viewed from the upper side, wherein a pair of field effect transistors of the present invention are disposed. As shown in FIG. 9a the gate electrode unit 14 has an inductance $L_e$ externally added thereto. The drain electrode unit is located on the lower portion of the integrated circuit and therefore is not illustrated.

FIG. 9b is a view similar to FIG. 9a but illustrating the inductances $L_e$ further added to the source electrode unit 12'.

Although only two field effect transistors are illustrated in FIGS. 9a and 9b, it is to be understood that any desired number thereof may be disposed in the integrated circuit. Further the inductance may be added to the drain electrode unit rather than the source electrode unit in the arrangement of FIG. 9b.

The present invention has been described in conjunction with field effect transistors but it will be appreciated that the improvement of the frequency characteristic through the utilization of a traveling wave structure is not restricted thereby or thereto and that the present invention is equally applicable to other semiconductor devices.

Since the present invention provides the vertical type of field effect transistors including at least one of the source, gate and drain electrodes disposed on one of the main opposite faces of the semiconductor substrate and the remaining electrode or electrodes disposed on the other main face of the substrate, a density with which the electrode is disposed on one face of the substrate can be high. That is, for a give area, the effective area for the electrode can be increased. Also due to the traveling wave structure parastic interelectrode capacitances are effectively used as structural elements of a transmission line involved so that if the field effect transistor is lengthened in a direction of travel of an electromagnetic wave, this provides a large area device without a decrease in either of input and output impedances thereof. Thus the device can be operated with a high power and provide a solid state oscillator for an equipment requiring a high power, such as an electronic oven. Further vertical type field effect transistors have the current-to-voltage characteristic that the current decreases with an increase in temperature. This facilitates the manufacturing of large area devices for producing high outputs without the breakdown thereof due to the local concentration of the current. In that event, an increase in capacitance does not bring about an extreme decreases in either of the input and output impedance because the capacitance forms the structural element of the transmission line. Unlike conventional field effect transistors including the source, gate and drain electrodes disposed on the same main face of the semiconductor substrate, the transistor of the present invention can be easily connected to ground which becomes important upon performing the traveling-wave operation. This is because at least one of the source, gate and drain electrodes thereof is disposed on that main face of the substrate opposed to the other main face on which the remaining electrode or electrodes is or are disposed. As the traveling wave operation is performed, the highest operative frequency increases to a threshold frequency as determined by a time period for which carriers travel from the source to the drain region but not limited by inter-electrode capacitances. While the present invention has been illustrated and described in conjunction with several preferred embodiments thereof it is to be understood that numerous changes and modifications may be resorted to without departing from the spirit and scope of the present invention. For example, although the source, gate or drain is shown in FIG. 6 or 8 as being disposed on the flat surface of the substrate, it may be disposed at a position somewhat cut into the surface.

What is claimed is:

1. A vertical type field effect transistor comprising a semiconductor substrate including a pair of main opposite faces, a source electrode, a gate electrode, and a drain electrode, at least one of said source, gate and drain electrodes being disposed on one of said main opposite faces, at least one of the remaining electrodes being disposed on the other main face of the substrate, an input terminal and an output terminal, wherein at least two highly doped semiconductor regions form respective ones of said electrodes and are formed elongated and slender and having a dimension and impurity concentration imparting thereto a low resistance in a direction of travel of an electromagnetic wave traveling therein to form a transmission line whereby the transistor performs in a traveling wave mode of operation, and wherein said transmission line includes a common line defined by one of said source and gate electrodes, an input line defined by said common line and the other of said source and gate electrodes, and an output line defined by said common line and said drain electrode, and said input and output terminals are disposed on opposite sides of said transistor substrate and respectively connected to said input line and said output line.

2. A vertical type field effect transistor as claimed in claim 1 wherein said electrodes forming said transmission line are divided into a plurality of parallel elongated slender portions.

3. A vertical type field effect transistor according to claim 1, wherein said source and gate electrodes are disposed on the same one of the main faces of said substrate, and said drain electrode is disposed on the other main face, and wherein at least said source and said gate electrodes are elongated and slender.

* * * * *